United States Patent
Dietrich et al.

(10) Patent No.: US 9,110,131 B2
(45) Date of Patent: Aug. 18, 2015

(54) METHOD AND DEVICE FOR CONTACTING A ROW OF CONTACT AREAS WITH PROBE TIPS

(75) Inventors: Claus Dietrich, Thiendorf OT Sacka (DE); Stojan Kanev, Thiendorf OT Sacka (DE); Frank Fehrmann, Priestewitz OT Basslitz (DE); Botho Hirschfeld, Dresden (DE)

(73) Assignee: Cascade Microtech, Inc., Beaverton, OR (US)

( * ) Notice: Subject to any disclaimer, the term of this patent is extended or adjusted under 35 U.S.C. 154(b) by 115 days.

(21) Appl. No.: 13/640,432

(22) PCT Filed: Apr. 13, 2010

(86) PCT No.: PCT/EP2010/054829
§ 371 (c)(1),
(2), (4) Date: Oct. 10, 2012

(87) PCT Pub. No.: WO2011/127962
PCT Pub. Date: Oct. 20, 2011

(65) Prior Publication Data
US 2013/0027070 A1    Jan. 31, 2013

(51) Int. Cl.
*G01R 1/067* (2006.01)
*G01R 31/28* (2006.01)

(52) U.S. Cl.
CPC .................. *G01R 31/2891* (2013.01)

(58) Field of Classification Search
CPC .................. G01R 31/2886–31/2891
USPC ............. 324/750.01, 750.23, 754.03, 755.01, 324/755.08, 762.05, 758, 757.01–757.05, 324/754.1, 756.01–756.07, 750.1–750.2, 324/754.01, 754.07, 754.08–754.12, 324/756.03, 756.01–757.05, 324/757.01–765.01; 348/87; 33/645; 382/151

See application file for complete search history.

(56) References Cited

U.S. PATENT DOCUMENTS

| | | |
|---|---|---|
| 3,996,517 A | 12/1976 | Fergason et al. |
| 4,864,227 A | 9/1989 | Sato |
| 4,992,659 A | 2/1991 | Abraham et al. |

(Continued)

FOREIGN PATENT DOCUMENTS

| | | | |
|---|---|---|---|
| DE | 10 2004 030881 A1 | 4/2005 | |
| JP | 405121498 | 5/1993 | |
| JP | 11248800 | * 9/1999 | ............. G01R 31/28 |

OTHER PUBLICATIONS

Machine Translation of JP 11248800, Inventor: A.Oshimoto, Data: Sep. 1999.*

(Continued)

*Primary Examiner* — Arleen M Vazquez
*Assistant Examiner* — Lee Rodak
(74) *Attorney, Agent, or Firm* — Dascenzo Intellectual Property Law, P.C.

(57) ABSTRACT

The invention generally relates to a method and device for contacting contact areas (22) with probe tips (18) in a tester. The contact areas (22), which are arranged on a substrate (6), and the probe tips (18) are positioned relative to each other and then brought in contact with each other by an advancing motion. In order to detect a secure contact for each of the probe tips (18), the contacting between the probe tips (18) and the contact areas (22) is observed from at least two observation directions (34), which include an observation angle α in a range of 0 to 180°.

19 Claims, 3 Drawing Sheets

(56) References Cited

U.S. PATENT DOCUMENTS

| | | | |
|---|---|---|---|
| 5,091,692 A * | 2/1992 | Ohno et al. | 324/750.23 |
| 5,243,665 A | 9/1993 | Maney et al. | |
| 5,394,100 A | 2/1995 | Bohler et al. | |
| 5,416,592 A | 5/1995 | Mori et al. | |
| 5,644,245 A * | 7/1997 | Saitoh et al. | 324/750.18 |
| 5,657,394 A | 8/1997 | Schwartz et al. | |
| 5,742,395 A * | 4/1998 | Biedermann et al. | 356/394 |
| 5,917,332 A | 6/1999 | Chen et al. | |
| 6,002,426 A | 12/1999 | Back et al. | |
| 6,096,567 A | 8/2000 | Kaplan et al. | |
| 6,356,093 B2 | 3/2002 | Nishikawa et al. | |
| 7,057,408 B2 * | 6/2006 | Schneidewind et al. | 324/750.19 |
| 7,733,108 B2 | 6/2010 | Kanev et al. | |
| 8,072,586 B2 | 12/2011 | Teich et al. | |
| 8,094,925 B2 | 1/2012 | Schneidewind et al. | |
| 2002/0011835 A1 | 1/2002 | Yamazaki | |
| 2003/0142862 A1 * | 7/2003 | Snow et al. | 382/154 |
| 2005/0278056 A1 | 12/2005 | Farnworth et al. | |
| 2006/0184041 A1 | 8/2006 | Andrews et al. | |
| 2007/0159194 A1 * | 7/2007 | Hasegawa et al. | 324/754 |
| 2008/0088833 A1 | 4/2008 | Yokota et al. | |
| 2008/0158664 A1 | 7/2008 | Teich et al. | |
| 2009/0085594 A1 | 4/2009 | Yamamoto et al. | |

OTHER PUBLICATIONS

English-language translation of Japanese Patent No. JP 405121498, May 1993.

English-language abstract of German Patent Publication No. DE 10 2004 030881 A2, published Apr. 14, 2005.

English-language translation of Japanese Patent Publication No. H11-248800A, Sep. 17, 1999.

* cited by examiner

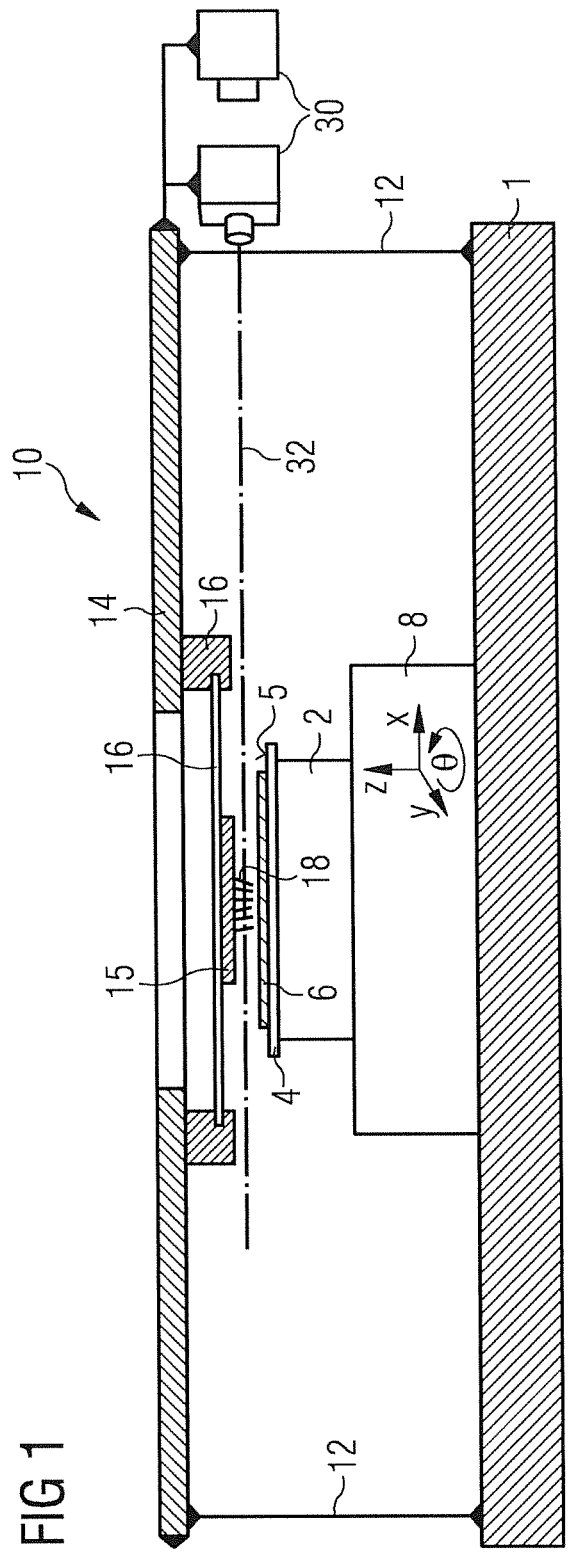

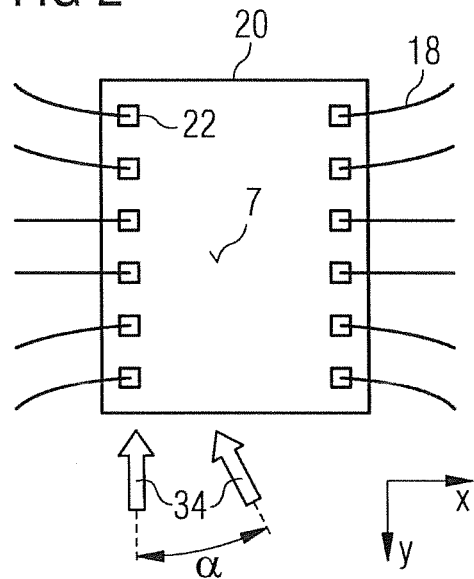
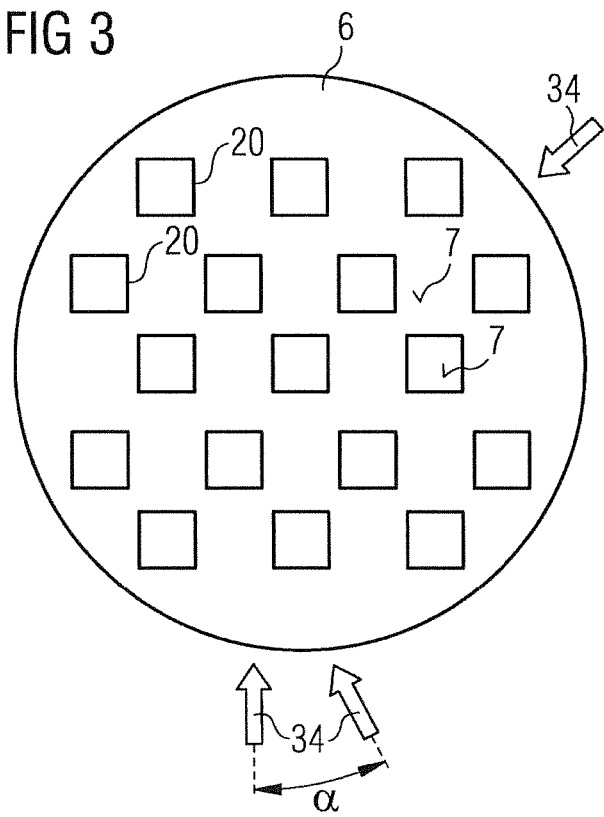

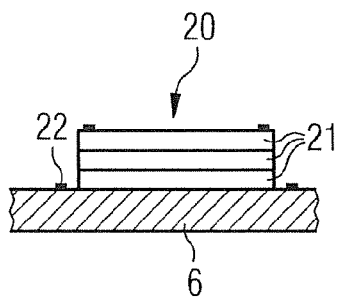
FIG 4A
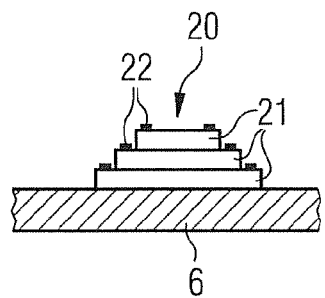
FIG 4B
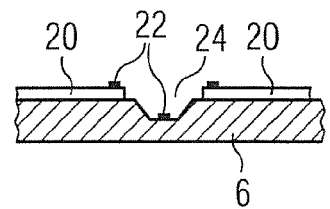
FIG 4C
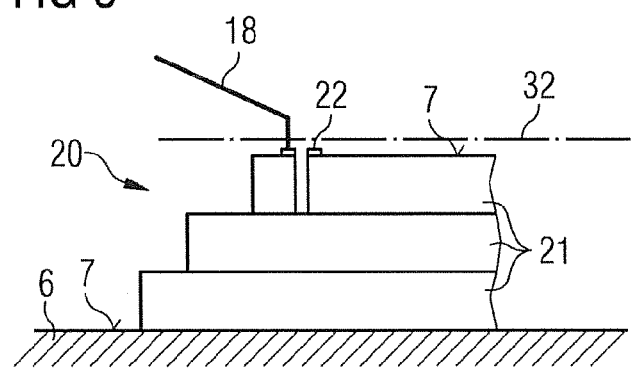
FIG 5
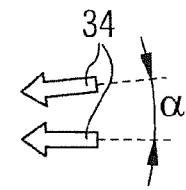
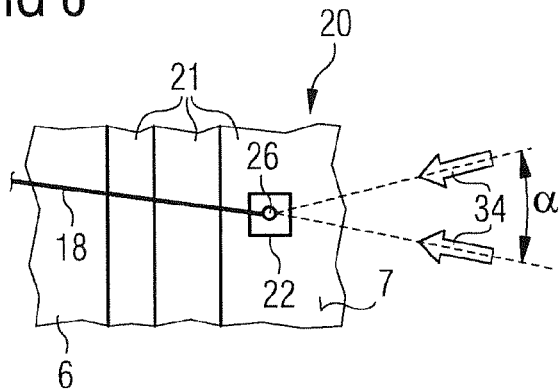
FIG 6

METHOD AND DEVICE FOR CONTACTING A ROW OF CONTACT AREAS WITH PROBE TIPS

RELATED APPLICATION

The present application claims priority under 35 U.S.C. §119 to PCT Patent Application Ser. No. PCT/EP2010/054829, entitled "Method And Device For Contacting A Row Of Contact Surfaces With Probe Tips," which was filed on Apr. 13, 2010, the complete disclosure of which is hereby incorporated by reference.

The invention relates generally to a method and a device for contacting contact areas with probe tips in a tester. In particular, it relates to contacts in which a row of contact areas are arranged next to one another on the surface of a substrate, and are simultaneously contacted by an array of probe tips that correspond to the row of contact areas.

Contacting relates to the contact areas of electronic components, which are formed on the surface of a wafer or other mounting substrate. In the following description, the surface having the contact areas to be contacted is generally designated as the substrate surface and the supporting structure, usually a semiconductor, is the substrate. The substrate surface can also be provided with steps and vertical face sections through special electronic component mounting technologies or processing steps for the wafer and mounting substrate.

The components usually have two or even four rows of contact areas, of which a plurality are to be contacted simultaneously so that the respective component can undergo a variety of tests. A plurality of components is usually arranged on a substrate in a grid, with or without offset of the rows and columns with respect to one another. The structures on the substrate are increasingly formed three dimensionally, i.e., so that the substrate surface has steps, which are formed, e.g. by stacked components or scribed grooves in the substrate for the subsequent separation of the components. Contact areas are also frequently arranged on the substrate itself between the electronic components, also in scribed grooves that can be contacted, e.g. for process control of the substrate treatment.

The formation of the contacts between the contact areas and the probe tips is usually carried out so that the substrate is first positioned in the plane of the substrate surface, which is usually oriented horizontally so that the contact areas and the probe tips are located above and at a distance from one another by means of a reciprocating device, and then in this case a vertical feeding motion takes place until the contact of the probe tips is formed with the contact areas. Even if the following description is related to the horizontal orientation of the contact areas, the paths of motion, planes and directions of observation, and the mechanisms used to accomplish this can be used in an analogous manner with different orientations of the contact areas.

The positioning of the contact areas and the probe tips relative to one another until they come into contact includes both movements of the substrate or the probe tips or both in the horizontal X and Y directions, and in the vertical Z-direction, as well as rotations about an angle $\Theta$, in order to align the rows of contact areas and probe tips with respect to one another. The various positioning steps are observed by means of an observation unit. The final feeding motion in the Z-direction is also observed with a horizontal looking observation unit in order to determine the formation of a secure contact in DE 10 2004 030 881 A1.

The invention likewise relates to a tester that is configured to implement the method. Such a tester typically includes a chuck, which has a flat receiving surface and holds the substrate, and a reciprocating device for moving at least the receiving surface of the chuck in the X-, Y-, and Z-directions, as well as rotating it about an angle $\Theta$. The tester also has the required probe tips that are held by one or more probe mounts in an array, so that the positions of the points correspond respectively to those of the opposing contact areas, and are thereby arranged opposite the substrate surface. In some testers the probe mounts are also connected to the reciprocating device, which makes the fine positioning and/or vertical feeding motion possible by means of the probe tips.

The increasing miniaturization of semiconductor circuits has the consequence that contact areas used either for making contacts for test purposes and/or for the formation of bonding contacts continue to shrink in size. Due to this fact, there is an increasing danger of faulty contacts in which a probe tip slips off the contact area or misses it completely during the feeding motion There are many different reasons for the faulty contacts.

The probe tips, which are constructed by using, e.g. so-called test cards that are built to be similar to a printed circuit board, and thus hold all probe tips and link electrically by means of printed circuits, or are held by separate probe mounts, in which the electrical link usually occurs through appropriate conductors, and which are sometimes available for aligning the tips through manipulators, are pre-positioned with respect to one another in this manner with respect to the contact area array. They are brought into contact with the contact areas on the substrate in this array by horizontal positioning and then by a vertical feeding motion.

In order to compensate for tolerances of the vertical distance of travel as a consequence of vertical tolerances in the array of a plurality of probe tips and guaranteeing the secure formation of a contact, the probe tips are made to be flexible, so that a so-called overdrive is possible, i.e. a vertical motion that exceeds the minimum position required for making the contact. The contacting needles are elastically deformed due to this overdrive, wherein a lateral motion of the probe tips occurs relative to the semiconductor surface. This is customarily called the scratch. This scratch is useful on the one hand for producing a secure contact, but it can also have such a large magnitude due to excessive height tolerances of the probe tips that a probe tip slips off the contact area, thereby losing the contact.

In both situations the reduction of the contact areas leads to increased requirements for observation of the contacting process. On the one hand, the scratch becomes increasingly smaller, and on the other, the danger increases that the probe tip slips off the contact area. The result is that the positioning and contacting process must be carried out with high precision, independent of the number and arrangement of the probe tips, since the horizontal and vertical tolerances that can be compensated for become smaller.

An observation of the probe tips and the scratch takes place either in an observation unit that lies parallel to the feeding motion, i.e. generally in the vertical direction, or in the horizontal direction parallel to the substrate surface (DE 10 2004 030 881 A1). However, these observational possibilities do not allow the simultaneous observation of a plurality of probe tips that are contacted by a common feeding motion. This is because the sizes of the contact areas, probe tips, and possibly also scratches to be observed do not allow viewing in the vertical direction over the entire row of contact areas. During a horizontal observation, on the other hand, probe tips mutually obscure one another if their scratches can no longer be attributed to the individual probe tips, or three dimensional structures on the substrate surface prevent a view of all the probe tips.

With the aid of the method according to the invention that is presented here and the device to be used for this purpose, it is possible to observe the contacting of the individual probe tips of a row on the corresponding contact areas.

The simultaneous observation from at least two different observation directions provides information in several respects from the depth of the image that can be obtained from a single observation direction. This depth information can be used both for two-dimensional as well as for three-dimensional structures on the substrate surface. By selecting the direction it is possible to resolve the array of probe tips or to look into the structures of the substrate surface.

In the first case, e.g. by the observation from two directions lying in a plane that is parallel to the substrate surface, all the probe tips that would otherwise lie behind one another can be observed. It is thereby possible, e.g. to separate the scratch of each of the probe tips so that the individual contacts can be monitored. However, misalignment of the probe tips can be determined with respect to the row of contact areas, either for individual probe tips or for the entire row, e.g. for insufficient angular alignment between the probe mount and the chuck.

Depending on the type of substrate testing, the observation unit used for this purpose and the possible motions of the observation unit and the substrate, the observation can be carried out simultaneously from a plurality of directions. An alternative sequential approach is also possible for the observation position, wherein it is possible to move either one or more observation units and/or by rotating the chuck. However, rotation of the chuck by itself allows only the selection of observation directions that are parallel to the receiving surface of the chuck, and thus to the substrate surface. Here the angle can be adjusted between 0 and 180°, depending on the design of the substrate or the array of probe tips.

Only a pivoting of the observation unit or the receiving surface of the chuck, insofar as possible, allows the adjustment of an observation direction in a plane perpendicular to the substrate surface, wherein the angle here is already limited to a maximum of 90° by restricting it to the upper half space above the substrate. This also allows a direct view onto the contact areas and is indeed complementary to a side observation, which can again, e.g. display the scratch.

The view toward the region in which the contacting process takes place from two different observation directions moreover allows a stereoscopic examination in which distances or positions can also be obtained from knowledge of geometrical quantities of the triangle passing through the two observation points and the probe tips or the contact area. In this manner an individual contact point can be examined in detail, e.g. in order to draw conclusions regarding the relative position of the probe tip array to the contact area array for approaching the contact position.

The various designs for examining the contacting process produce a three-dimensional image of the contact region for the evaluation of the contacting process of an array having multiple probe tips.

The invention will now be described in greater detail with the aid of embodiments. The accompanying drawings show FIG. 1 the schematic design of a tester having two observation units, FIG. 2 an electronic component that is contacted by means of a plurality of probe tips in a top view, FIG. 3 the top view onto a wafer having a plurality of electronic components and various possible observation directions, FIG. 4A to FIG. 4C substrate surfaces with different structures, FIG. 5 the observation of contacting a contact area from two observation directions in a plane perpendicular to the substrate surface, and FIG. 6 the stereoscopic observation of a probe tip on a contact area.

The tester in FIG. 1 has a base frame 1. The base frame supports a chuck 2 and a probe mount 10. The chuck 2 includes a receiving plate 4 with a receiving surface 5 on which a substrate 6, a wafer in the embodiment, can be placed and held. The probe mount 10 includes a probe mounting plate 14 and a sample card 15, which holds a plurality of probe tips 18, also known as samples, in a fixed array with respect to one another.

The probe mount 10 is mounted on the base frame 1 by means of a suitable mount 12 in such a way that the sample card 15 lies opposite the substrate 6 at a distance, so that the probe tips 18, which are mounted on the lower side of the sample card 15 facing toward the substrate 6, can touch contact areas (not shown) on the substrate 6.

The receiving plate 4 and a substrate 6 that is arranged on it can be moved by means of a suitable reciprocating device 8, in order to position the contact areas of the substrate 6 with respect to the probe tips 18. In the embodiment, movements of the receiving plate 4 in the X-, Y-, and Z-direction as well as rotations of the angle Θ about a central axis oriented in the Z-direction are possible by means of the reciprocating device 8. The directions of motion are shown in FIG. 1 with the aid of a coordinate system. In other embodiments of the tester, the reciprocating device can support the probe mounts 10 in a complementary or alternative manner, so that these movements can also implement the positioning of probe tips 18 and contact areas relative to one another.

Any region in the tester in which the contact between the probe tips 18 and contact areas 22 is produced by means of the reciprocating device is referred to as a contact zone. Its possible location depends significantly on the spatial region in which probe tips 18 and contact areas 22 can be moved. If the probe tips 18, for example, are stationary and the positioning and the feeding motion up to contact is produced only by the chuck 2, then the contact zone is defined only by the location of the probe tips 18.

In order to make contact between a plurality of contact areas of the substrate 6, the probe tips 18 are mounted on a sample card 15 in an array that corresponds to the contact area array. The sample card 15 is attached to the underside of the probe mounting plate 14 by means of a sample card mount 16. The probe tips 18 point downwardly and make contact with the contact areas on the upward facing free surface of the substrate 6. According to the above definition, the contact zone is a space in which probe tips 18 and contact areas 22 are in contact. Such a space is provided between the sample card 15 and the free surface of the substrate 6, which is bridged by the probe tips 18 in any position of the substrate 6 in which the contact between probe tips 18 and contact areas is produced.

The invention is also not fundamentally limited to contacting the substrate 6 shown here. It is also possible to make a contact on the underside when the free surface of the substrate 6 points downwardly and the probe tips 18 point upwardly, in order to carry out a back side observation of the substrate 6, for example. However, only the process of contacting from above is shown in the embodiment.

A row of probe tips 18 is shown in the schematic drawing of the tester according to FIG. 1. An additional row of probe tips 18 lies behind this row in the direction of observation, so that all contact areas 22 of an electronic component 20 on the substrate 6 can be contacted with this array. An individual component 20, many of which are included on the substrate 6, is shown in FIG. 2 with its contact areas 22 arranged regularly in two rows and the probe tips 18 lying on them, of which only the tips in the immediate vicinity of the contact areas 22 are shown for reasons of clarity. The probe tips 18 make contact simultaneously in the position of the contact areas 22 shown here.

In order to observe the contacting process, two observation units 30, e.g. CCD cameras and/or microscopes, are arranged along the side of the sample card mount 16 and at a distance from it that permits the chuck 2 to travel so that each point on the substrate 6 can be contacted. They are attached to the probe mounting plate 14 (FIG. 1) in the embodiment. The observation units 30 both lie in a plane of observation 32 that passes through the optical axis of both observation units 30, through the probe tip region 18 and parallel to the substrate surface 7, and is separated by a distance from it. Both observation units 30 point with a respective focus onto the probe tips 18 in the contact zone, but each from a different observation direction 34.

The observation directions 34 of both observation units 30 are shown within the plane of observation 32 in a top view in FIG. 2. While one observation direction 34 is in line with the row of probe tips 18, the other observation unit 30 is pivoted through the angle α, which can amount to a few degrees, for example. The size of the angle α depends on the possible unobstructed view onto the probe tips 18, and can lie in principle between 0 and 180°, wherein these limiting values are excluded since otherwise both observation directions 34 would coincide at 180°, but with opposite directions, whereby the depth information that is desired can no longer be obtained by means of this second observation direction 34. In order to obtain additional information, more than two observation directions 34 can also be selected that can also include different planes of observation 32.

The unobstructed view onto the probe tips 18 depends on the probe tip array 18 itself, and likewise on the surface structure of the substrate 6. This is because the probe tips 18 and the contact areas 22 can respectively conceal each other on the one hand. On the other hand, three dimensional surface structures on the substrate 6 can block the view of the probe tips 18 and/or the contact areas 22.

The first situation is shown in FIG. 2, since a first observation direction 34 coincides precisely with the direction of the row of contact areas 22 and the probe tips 18 that make contact on them. In this observation direction 34 the position of the probe tips 18 can be observed in the X-direction and the Z-direction, and thus the formation of a secure contact is observed. If this first observation direction 34 and the row of probe tips 18 are parallel, however, this statement is valid only for the first probe tip 18 of the row. As usual, a secure contact is likewise formed from the observation direction of the rear probe tips 18, by means of the second observation direction 34 that deviates from the first by the angle α.

The observation from the second observation direction 34 also allows the state of contact to be determined for the other rear probe tips 18. Deviations in the angular direction of the rows of probe tips 18 and contact areas 22 can thereby be determined, or individual faulty contacts can be detected based on height tolerances within the two rows. The scratch on each individual probe tip 18 can be resolved through the second observation direction 34. If this or another third observation direction 34 (not shown) is selected, which is pivoted out of the plane of the drawing and is thus defines a plane with the first observation direction 34 that is not parallel to the substrate surface 7, but makes an angle with respect to the substrate surface 7 in the range up to 90°, the contact areas 22 can also be viewed. It can thus be determined whether a probe tip 18 may have slipped from a contact area 22.

FIG. 3 schematically shows an example of the case in which surface structures of the substrate 6, in this case displaced rows of electronic components 20, can prevent the observation of the contacting process. Depending on the location of the contact areas 22 that are to be contacted, different observation directions 34 that are shown in FIG. 3, e.g. as arrows, are chosen to obtain the desired information for one or a plurality of probe tips 18. As described in FIG. 2, the observation directions 34 that are shown lie in different planes of observation 32. They can extend parallel to the substrate surface or can make an angle with respect to it. Different information can be obtained according to the situation.

Different possible surface structures of a substrate 6 are shown as examples in FIG. 4A to 4C. Individual components 21 are stacked into a complex component 20 in FIG. 4A and FIG. 4B, e.g. components 21 of the same size (FIG. 4A) or with decreasing size for an increasing stack height (FIG. 4B), wherein the contact areas 22 that are to be contacted as a function of the stack type between the components 20 (FIG. 4A and FIG. 4C), on the uppermost area of a component (FIG. 4A), on steps inside the stack of components (FIG. 4B), in depressions 24 inside the substrate 6, e.g. scribed grooves can be distributed on other possible places on the substrate 6

The unobstructed view, along with the selection and number of observation directions 34 that are used, also influences the selection and number of the planes of observation. It can lie precisely in the plane of the contact areas 22 or parallel and above it. If the selected plane of observation 32, e.g. lies only a small distance above the contact areas 22, then mirror images of the probe tips 18 on the surface can be used when suitable lighting and surface quality is present, in order to observe the approximation. As soon as the probe tips 18 are in the immediate vicinity of the surface, their mirror image and final movement in the direction of the contact areas 22 are visible. If the mirror image meets the image of the contact needle, only a minimal distance of several micrometers is present between probe tips 18 and contact areas 22, or the probe tips 18 already lie on the contact areas 22.

Different positions and shapes of the contact areas 22 in which an observation of the contacting process takes place in two observation directions 34 that lie at an angle or in particular perpendicular to the substrate surface 7, are shown in FIG. 4C and FIG. 5. Based on the array of contact areas 22 in grooves or other depressions 24 of the substrate 6 in FIG. 4C an examination from above into the depressions 24 can take place, since otherwise an observation of the contacting process is not possible, or is possible only in the direction of the depression 24, insofar as it extends through the entire substrate 6.

In FIG. 5 the contacting of the probe tips 18 takes place on a structured contact area 22 in the embodiment shown for the contact area 22 that surrounds a through contact. Here too, information regarding the precise location of the probe tips 18 can be obtained with respect to the through contact 26 of the electronic component 20 from the view onto the contact areas 22 with an observation direction 34 that has an angle α greater than 0 with respect to the substrate surface 7.

By this observation of a probe tip 18, a stereoscopic examination is also possible through which distances can be obtained by using known geometrical relationships, like the distance of the two observation units with respect to one another and the angle adjusted for bringing the probe tips 18 or the contact areas 22 into focus. These are of interest, for example, if a faulty contact had been detected.

The observation from two different observation directions 34, both of which lie parallel to the substrate surface 7, is shown in FIG. 6 for the stereoscopic examination of a probe tip 18.

For stereoscopic examination it is necessary that the observation from the different observation directions 34 be carried out simultaneously with two observation units. This can be advantageous in other applications as well, particularly when the time required for forming and identifying the contact must be minimized. This situation is encountered, e.g. during continuous testing in which the throughput is significant.

In other applications the two or more different observation directions 34 can also be set up sequentially with a single observation unit 30. This is always possible if the necessary time is available and the sequentially obtained information is of interest itself or can be correlated subsequently, e.g. by computer assisted processing.

The motion sequence that is required for the contacting procedure depends significantly on which components have to be moved by means of the reciprocating device, as has already been discussed above. Thus, all motion sequences can be carried out solely by the chuck 2. Individual motion segments, e.g. fine adjustments or the feeding motion, can also be performed at least to some extent by a component of the reciprocating device 2, which is in contact with the probe mounts 10 and is suitable for moving the probe tips 18 together or separately.

The contacting of a component according to FIG. 2 will now be demonstrated with the aid of the chuck motion by itself and with a tester according to FIG. 1. Since the final feeding motion is especially important for the observation of the contacting process to determine and secure a good contact, and consequently the region of observation is concentrated on this area surrounding the contact zone, the observation is to the greatest extent possible independent of the actual immediate motion sequences.

In the contacting process, the substrate 6 is first aligned horizontally by the reciprocating device 8 of the tester so that the contact areas 22 that are to be contacted are located precisely in the middle and perpendicular below the probe tips 18, spaced a distance from the tips. This horizontal alignment preferably takes place in a position of the chuck 2 that is removed and thus easily accessible, such that the position of the probe tips 18 is set exactly with respect to a fixed reference point plus a precisely defined distance for the midpoint of each contact area 22 in the X- and Y-direction with respect to the same reference point.

The substrate 6 is consequently pre-positioned vertically to within a small distance between the contact areas 22 and the probe tips 18 by means of the reciprocating device 8. The contact is made from this position of the contact area 22 by the additional vertical motion of the substrate 6 that is produced by the precision drive of the final feeding motion.

The observation of one or a plurality of probe tips 18 occurs during this vertical motion of the substrate 6 just before contacting and during the contacting process of the probe tips 18 with the contact areas 22. The substrate 6 is thus moved by the reciprocating device 8 from below toward the probe tips 18. After the initial placement of at least one observed probe tip 18 on the corresponding contact area 22, the feeding motion is advanced by racking out an overdrive so that each of the already placed probe tips 18 begins to deform elastically. The onset and extent of this deformation and the resulting scratches can be determined for each of the probe tips 18 by means of both observation units 30, e.g. by means of CCD cameras. The feeding motion can be stopped after a specified minimum degree of deformation has been observed for all probe tips 18. It is thereby ensured that the overdrive does not lead to the slipping of a probe tip 18 from its assigned contact area 22.

On the other hand, if it is determined that the predefined amount of deformation has not been achieved for one or a plurality of probe tips 18, but has already been exceeded for others, the necessity for a readjustment can result between the substrate 6 and the array of probe tips 18 or the probe tips with respect to one another, or conclusions regarding the quality of the component 20 or the substrate 6 can be drawn. Additional information required for this purpose, like the dimensions of an individual faulty contact or an offset between probe tips 18 and contact areas 22, or other fault patterns can also be obtained with the existing images or by additional images that can be made subsequently from different observation directions 34.

Method and Device for Contacting a Row of Contact Areas with Probe Tips

REFERENCE SYMBOLS 1 base frame
2 chuck
4 receiving plate
5 receiving surface
6 substrate
7 substrate surface
8 reciprocating device
10 probe mount
12 mount
14 probe mounting plate
15 sample card
16 sample card mount
18 probe tip
20 component
21 component
22 contact areas
24 depression
26 through contact
30 observation unit
32 plane of observation
34 observation direction
α observation angle

The invention claimed is:

1. A method for contacting a plurality of contact areas with a corresponding array of probe tips, wherein the plurality of contact areas is arranged in at least one row on a surface of a semiconductor substrate, wherein the plurality of contact areas and the array of probe tips are positioned relative to one another with a reciprocating device such that the plurality of contact areas and the array of probe tips are opposed to one another and separated by a separation distance in a vertical direction, the method comprising:

contacting the plurality of contact areas with corresponding probe tips of the array of probe tips by moving the plurality of contact areas and the array of probe tips toward one another with a vertical feeding motion of the reciprocating device; and observing a contact zone between a probe tip of the array of probe tips and a corresponding contact area of the plurality of contact areas with an observation unit during the contacting, wherein the observing includes:

observing the contact zone from a first observation direction; and observing the contact zone from a second observation direction that is different from the first observation direction, wherein the first observation direction and the second observation direction are defined in a plane of observation that is at least one of parallel to the surface of the semiconductor substrate and coplanar with the surface of the semiconductor substrate, and further wherein the first observation direction and the second observation direction define an observation angle that is between 0 and 180 degrees.

2. The method of claim 1, wherein the observation angle is greater than 0 degrees and less than 90 degrees.

3. The method of claim 1, wherein the observing from the first observation direction and the observing from the second observation direction are performed sequentially.

4. The method of claim 1, wherein the observing from the first observation direction and the observing from the second observation direction are performed simultaneously.

5. The method of claim 1, wherein the contact zone includes a plurality of probe tips, and further wherein the observing includes simultaneously observing the plurality of probe tips during the contacting.

6. The method of claim 1, wherein the semiconductor substrate defines a recessed region, wherein the contact zone is located within the recessed region, and further wherein the observing includes observing at least one contact area of the plurality of contact areas that is located within the recessed region.

7. The method of claim 6, wherein the recessed region is defined between two stacked components that are mounted on the substrate surface.

8. The method of claim 6, wherein the recessed region is defined within a scribed groove that extends within the semiconductor substrate.

9. The method of claim 1, wherein the observing includes observing a deformation of each probe tip of the array of probe tips during the contacting.

10. The method of claim 9, wherein the contacting includes ceasing the moving responsive to determining that each probe tip of the array of probe tips has experienced a specified minimum degree of deformation.

11. The method of claim 9, wherein the observing the contact zone includes detecting a faulty contact.

12. The method of claim 11, wherein the method further includes adjusting an alignment of the semiconductor substrate relative to the array of probe tips responsive to the detecting.

13. The method of claim 1, wherein the first observation direction is parallel to the at least one row.

14. The method of claim 1, wherein the observing the contact zone includes observing a mirror image of the array of probe tips on the surface of the semiconductor substrate.

15. A system for contacting a plurality of contact areas that are arranged in at least one row on a surface of a semiconductor substrate, the system comprising:
 a chuck that defines a receiving surface that is configured to receive the semiconductor substrate;
 a probe mount that includes an array of probe tips;
 a reciprocating device that is configured to position the chuck and the array of probe tips relative to one another to permit contact between the plurality of contact areas and corresponding probe tips of the array of probe tips; and
 an observation unit that is configured to observe a contact zone between a probe tip of the array of probe tips and a corresponding contact area of the plurality of contact areas, wherein the observation unit is configured to permit the contact zone to be viewed, via the observation unit, from two different observation directions by pivoting while maintaining the two different observation directions within a plane of observation that is at least one of parallel to the surface of the semiconductor substrate and coplanar with the surface of the semiconductor substrate, wherein the two different observation directions define an observation angle that is between 0 and 180 degrees.

16. The system of claim 15, wherein the observation unit further is configured to move in a plane that is perpendicular to the receiving surface.

17. The system of claim 16, wherein the observation angle is between 0 degrees and 90 degrees.

18. The system of claim 15, wherein the observation unit is a first observation unit, and further wherein the system includes a second observation unit.

19. The system of claim 18, wherein the first observation unit is configured to observe the contact zone from a first observation direction, and further wherein the second observation unit is configured to observe the contact zone from a second observation direction that is different from the first observation direction.

* * * * *